United States Patent
Park et al.

(10) Patent No.: US 10,466,556 B2
(45) Date of Patent: Nov. 5, 2019

(54) GATE DRIVING UNIT AND LIQUID CRYSTAL DISPLAY DEVICE INCLUDING THE SAME

(71) Applicant: LG Display Co., Ltd., Seoul (KR)

(72) Inventors: Hyun-Ho Park, Gyeongsangbuk-do (KR); Min-Ho Lee, Gyeongsangbuk-do (KR)

(73) Assignee: LG Display Co., Ltd., Seoul (KR)

( * ) Notice: Subject to any disclaimer, the term of this patent is extended or adjusted under 35 U.S.C. 154(b) by 11 days.

(21) Appl. No.: 15/388,051

(22) Filed: Dec. 22, 2016

(65) Prior Publication Data

US 2017/0192271 A1    Jul. 6, 2017

(30) Foreign Application Priority Data

Dec. 30, 2015    (KR) .................. 10-2015-0190198

(51) Int. Cl.
| | |
|---|---|
| *G02F 1/1368* | (2006.01) |
| *G09G 3/36* | (2006.01) |
| *H01L 27/12* | (2006.01) |
| *H01L 29/417* | (2006.01) |

(Continued)

(52) U.S. Cl.
CPC ........ *G02F 1/1368* (2013.01); *G02F 1/13454* (2013.01); *G09G 3/3677* (2013.01); *H01L 27/1214* (2013.01); *H01L 29/41733* (2013.01); *H01L 29/78696* (2013.01); *G02F 2201/124* (2013.01); *G09G 3/3688* (2013.01); *G09G 2300/0426* (2013.01); *G09G 2310/0267* (2013.01); *G09G 2310/0286* (2013.01);

(Continued)

(58) Field of Classification Search
CPC . G02F 1/1368; G02F 1/13454; G09G 3/3677; H01L 27/1214; H01L 27/1225; H01L 29/41733
USPC ........................................ 345/213
See application file for complete search history.

(56) References Cited

U.S. PATENT DOCUMENTS

| | | | |
|---|---|---|---|
| 2004/0173795 A1* | 9/2004 | Moon | ............... H01L 29/41733 257/59 |
| 2008/0002125 A1 | 1/2008 | Kim | |

(Continued)

FOREIGN PATENT DOCUMENTS

| | | |
|---|---|---|
| CN | 101097320 A | 1/2008 |
| CN | 101504952 A | 8/2009 |

(Continued)

OTHER PUBLICATIONS

Chinese Office Action dated Dec. 25, 2018, issued in counterpart Chinese Patent Application No. 201611272952.4.

*Primary Examiner* — Fred Tzeng
(74) *Attorney, Agent, or Firm* — Morgan, Lewis & Bockius LLP

(57) ABSTRACT

A gate driving unit includes a plurality of stages sequentially outputting a plurality of gate signals, wherein each of the plurality of stages includes a first transistor including: a gate electrode; a gate insulating layer on the gate electrode; and a source electrode and a drain electrode on the gate insulating layer over the gate electrode, the source electrode and the drain electrodes spaced apart from each other, and wherein a first area where the gate electrode and the source electrode overlap each other is 2.5 times to 6 times of a second area where the gate electrode and the drain electrode overlap each other.

15 Claims, 7 Drawing Sheets

(51) Int. Cl.
  *G02F 1/1345*  (2006.01)
  *H01L 29/786*  (2006.01)

(52) U.S. Cl.
  CPC ............... *G09G 2310/0289* (2013.01); *G09G 2310/0291* (2013.01); *G09G 2310/08* (2013.01)

(56) References Cited

U.S. PATENT DOCUMENTS

| | | | | |
|---|---|---|---|---|
| 2009/0195724 A1* | 8/2009 | Park | ................... | H01L 29/41733 349/46 |
| 2010/0051952 A1* | 3/2010 | Kim | ................... | H01L 27/1214 257/59 |
| 2011/0174234 A1* | 7/2011 | Friberg | ................ | A01K 13/004 119/609 |
| 2012/0056858 A1* | 3/2012 | Ahn | ....................... | G11C 19/28 345/204 |
| 2012/0082287 A1* | 4/2012 | Moriwaki | ............. | G11C 19/28 377/64 |
| 2012/0087460 A1* | 4/2012 | Moriwaki | ........... | H01L 27/0255 377/64 |
| 2013/0140556 A1 | 6/2013 | Park et al. | | |
| 2013/0249872 A1 | 9/2013 | Kang et al. | | |
| 2015/0153604 A1* | 6/2015 | Lee | ..................... | G02F 1/13454 349/43 |
| 2016/0204136 A1* | 7/2016 | Takeuchi | ............ | H01L 27/1225 345/213 |
| 2016/0282666 A1* | 9/2016 | Ro | ...................... | G02F 1/13454 |

FOREIGN PATENT DOCUMENTS

| | | |
|---|---|---|
| CN | 103151358 A | 6/2013 |
| CN | 103325350 A | 9/2013 |
| CN | 103680442 A | 3/2014 |
| CN | 103680442 B | 9/2015 |
| CN | 103325350 B | 11/2015 |
| KR | 10-2015-0059005 A | 5/2015 |

* cited by examiner

GATE DRIVING UNIT AND LIQUID CRYSTAL DISPLAY DEVICE INCLUDING THE SAME

CROSS-REFERENCE TO RELATED APPLICATIONS

This application claims the benefit of Korean Patent Application No. 10-2015-0190198, filed on Dec. 30, 2015, in the Korean Intellectual Property Office, which is incorporated herein by reference in its entirety.

BACKGROUND

1. Technical Field

The present disclosure relates to a liquid crystal display device, and more particularly, to a gate driving unit for a narrow bezel and a liquid crystal display device including the gate driving unit.

2. Discussion of the Related Art

Recently, as the information society progresses, display devices processing and displaying a large amount of information have rapidly advanced and various flat panel displays (FPDs) have been developed. For example, the FPDs may include liquid crystal display (LCD) devices, plasma display panel (PDP) devices, organic light emitting diode (OLED) display devices and field emission display (FED) devices.

In general, a display device includes a display panel displaying an image and a driving unit supplying a signal and a power to the display panel. The driving unit includes a gate driving unit and a data driving unit supplying a gate voltage and a data voltage, respectively, to a pixel region of the display panel, and a timing controlling unit controlling the gate driving unit and the data driving unit.

The gate driving unit includes a gate shift register generating a gate signal using a gate control signal.

FIG. 1 is a cross-sectional view showing a pull up transistor of an output buffering part in a gate shift register according to the related art, and FIG. 2 is a plan view showing a pull up transistor of FIG. 1.

In FIG. 1, a pull up transistor TU includes a gate electrode G, a gate insulating layer 13, an active layer 15, an ohmic contact layer 16, a source electrode S and a drain electrode D. The gate electrode G is formed on a substrate 11, and the gate insulating layer 13 is formed on the gate electrode G. The active layer 15 is formed on the gate insulating layer 13 over the gate electrode G, and the ohmic contact layer 16 is formed between the active layer 15 and the source electrode S and between the active layer 15 and the drain electrode D. The source electrode S and the drain electrode D are formed on the gate insulating layer 13 and are spaced apart from each other.

Although not shown, the gate electrode G of the pull up transistor TU is connected to a Q node, the drain electrode D of the pull up transistor TU is connected to a signal line supplying a clock signal, and the source electrode S of the pull up transistor TU is connected to a signal line outputting a gate signal.

Since the clock signal having a relatively high frequency and a relatively high voltage is applied to the drain electrode D of the pull up transistor TU, the gate signal outputted from the source electrode S of the pull up transistor TU may become unstable. To prevent the unstable gate signal, the pull up transistor TU may be formed to have a largest size among the transistors of the gate shift resistor.

In the pull up transistor TU, a first area a where the gate electrode G and the drain electrode D overlap each other is the same as a second area b where the gate electrode G and the source electrode S overlap each other (a=b). Since the first and second areas a and b are the same as each other, a capacitance of a parasitic capacitor between the drain electrode D and the gate electrode G is the same as a capacitance of a parasitic capacitor between the source electrode S and the gate electrode G.

In FIG. 2, the source electrode S and the drain electrode D overlap the gate electrode G. The source electrode S of the pull up transistor TU includes a plurality of first source electrodes S1 each having a bar shape and a second source electrode S2 connected to ends of the plurality of first source electrodes S1. The drain electrode D includes a plurality of first drain electrodes D1 each having a bar shape and a second drain electrode D2 connected to ends of the plurality of first drain electrodes D1. The second source electrode S2 and the second drain electrode D2 face into each other. The plurality of first source electrodes S1 and the plurality of first drain electrodes D1 are alternately disposed with each other and are spaced apart from each other. The other ends of the plurality of first source electrodes S1 are spaced apart from the second drain electrode D2, and the other ends of the plurality of first drain electrodes D1 are spaced apart from the second source electrode S2.

Each of the plurality of first drain electrodes D1 has the same width and the same length as each of the plurality of first source electrodes S1, and the plurality of first drain electrodes D1 and the plurality of first source electrodes S1 are spaced apart from each other by the same distance. As a result, the first area a where the drain electrode D and the gate electrode G overlap each other is the same as the second area b where the source electrode S and the gate electrode G overlap each other, and a plurality of channels are constituted between the plurality of first source electrodes S1 and the plurality of first drain electrodes D1.

A gate-in-panel (GIP) type LCD device where a gate driving unit is integrated in a display panel has been suggested, and the LCD device is required to have a narrow bezel which is defined as a width of a non-display region outside a display region for a slim design of a final product such as a monitor or a television as well as a light weight and a thin profile.

However, in the GIP type LCD device according to the related art, since the pull up transistor TU is formed to have a sufficient width W for the plurality of channels, it is limited to obtain the narrow bezel.

SUMMARY

Accordingly, embodiments of the present disclosure relate to a gate driving unit and a liquid crystal display device including the gate driving unit that substantially obviate one or more of the problems due to limitations and disadvantages of the related art.

An object of the present disclosure is to provide a gate driving unit and a liquid crystal display device including the gate driving unit for obtaining a narrow bezel.

Additional features and advantages of the invention will be set forth in the description that follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a gate driving unit comprises a plurality of stages sequentially outputting a plurality of gate signals, wherein each of the plurality of stages includes a first transistor including: a gate electrode; a gate insulating layer on the gate electrode; and a source electrode and a drain electrode on the gate insulating layer over the gate electrode, the source electrode and the drain electrodes spaced apart from each other, and wherein a first area where the gate electrode and the source electrode overlap each other is 2.5 times to 6 times of a second area where the gate electrode and the drain electrode overlap each other.

In another aspect, a liquid crystal display device comprises a display panel, a gate driving unit, a data driving unit and a timing controlling unit, the gate driving unit including a plurality of stages sequentially outputting a plurality of gate signals, wherein each of the plurality of stages includes a first transistor including: a gate electrode; a gate insulating layer on the gate electrode; and a source electrode and a drain electrode on the gate insulating layer over the gate electrode, the source electrode and the drain electrodes spaced apart from each other, and wherein a first area where the gate electrode and the source electrode overlap each other is 2.5 times to 6 times of a second area where the gate electrode and the drain electrode overlap each other.

It is to be understood that both the foregoing general description and the following detailed description are explanatory, and are intended to provide further explanation of the embodiments as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain the principles of the disclosure.

DETAILED DESCRIPTION

Figure 1:
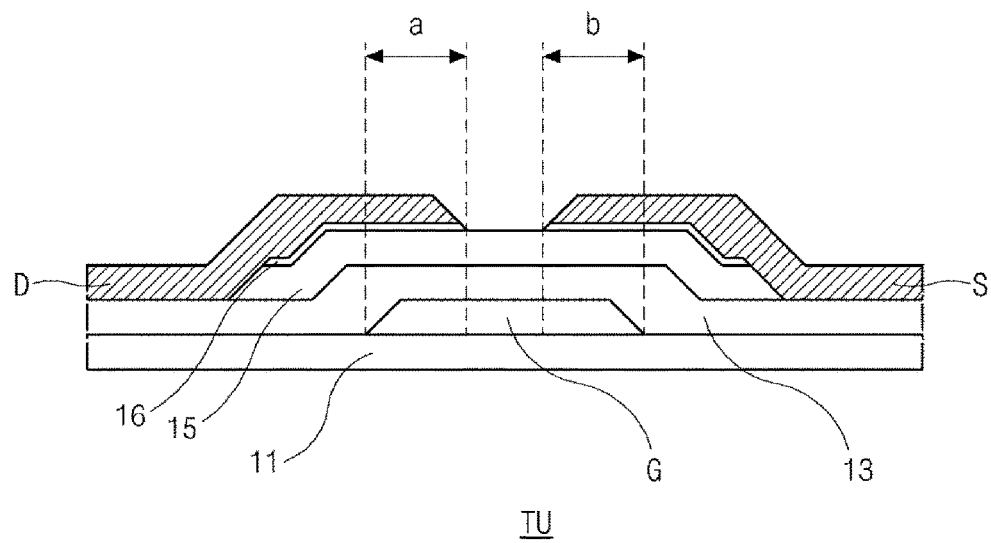
FIG. 1 is a cross-sectional view showing a pull up transistor of an output buffering part in a gate shift register according to the related art.

Reference will now be made in detail to embodiments of the present disclosure, examples of which are illustrated in the accompanying drawings. In the following description, when a detailed description of well-known functions or configurations related to this document is determined to unnecessarily cloud a gist of an embodiment of the disclosure, the detailed description thereof will be omitted. The progression of processing steps and/or operations described is an example; however, the sequence of steps and/or operations is not limited to that set forth herein and may be changed as is known in the art, with the exception of steps and/or operations necessarily occurring in a certain order. Like reference numerals designate like elements throughout. Names of the respective elements used in the following explanations are selected only for convenience of writing the specification and may be thus different from those used in actual products.

Figure 3:
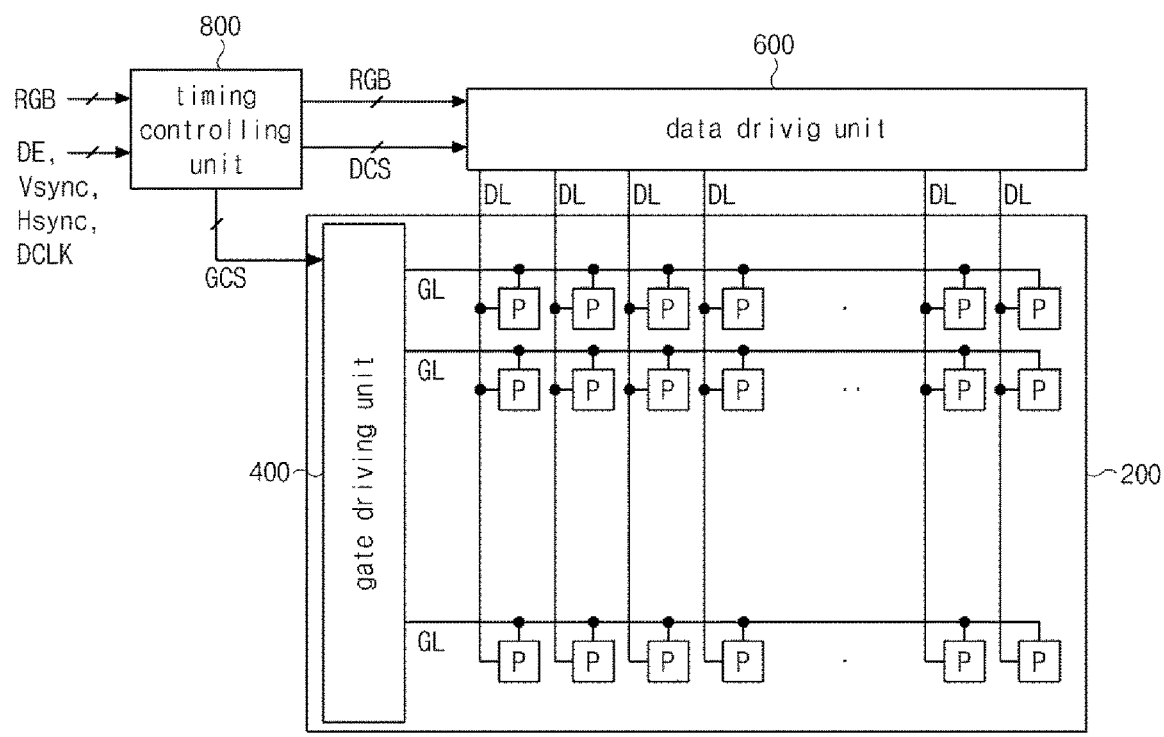
FIG. 3 is a view showing a liquid crystal display device according to an embodiment of the present disclosure.

FIG. 3 is a view showing a liquid crystal display device according to an embodiment of the present disclosure.

In FIG. 3, a liquid crystal display device according to an embodiment of the present disclosure includes a display panel 200, a gate driving unit 400, a data driving unit 600 and a timing controlling unit 800.

The display panel 200 includes a plurality of gate lines GL and a plurality of data lines DL crossing each other, and a plurality of pixels P are disposed at crossing of the plurality of gate lines GL and the plurality of data lines DL. The plurality of pixels display an image according a data signal (a data voltage) supplied from the plurality of data lines DL in response to a gate signal supplied from the plurality of gate lines GL.

The gate driving unit 400 may be formed in a non-display region of the display panel 200 to have a gate-in-panel (GIP) type. The gate driving unit 400 may include a gate shift register supplying the gate signal to the plurality of gate lines GL according to a plurality of gate control signals GCS provided by the timing controlling unit 800.

The data driving unit 600 may convert a digital image data RGB inputted from the timing controlling unit 800 into the data signal using a reference gamma voltage according to a plurality of data control signals DCS provided by the timing controlling unit 800 and may supply the data signal to the plurality of data lines DL.

The timing controlling unit 800 may arrange the image data RGB inputted from an exterior according to a size and a resolution of the display panel 200 and may supply the image data to the data driving unit 600. The timing controlling unit 800 may generate the plurality of gate control signals GCS and the plurality of data control signals DCS using synchronization signals such as a dot clock signal DCLK, a data enable signal DE, a horizontal synchronization signal Hsync and a vertical synchronization signal Vsync inputted from the exterior and may supply the plurality of gate control signals GCS and the plurality of data control signals DCS to the gate driving unit 400 and the data driving unit 600, respectively. The plurality of gate control signals GCS may include a plurality of clock signals having different phases and a start voltage indicating a start of operation of the gate driving unit 400.

Figure 4:
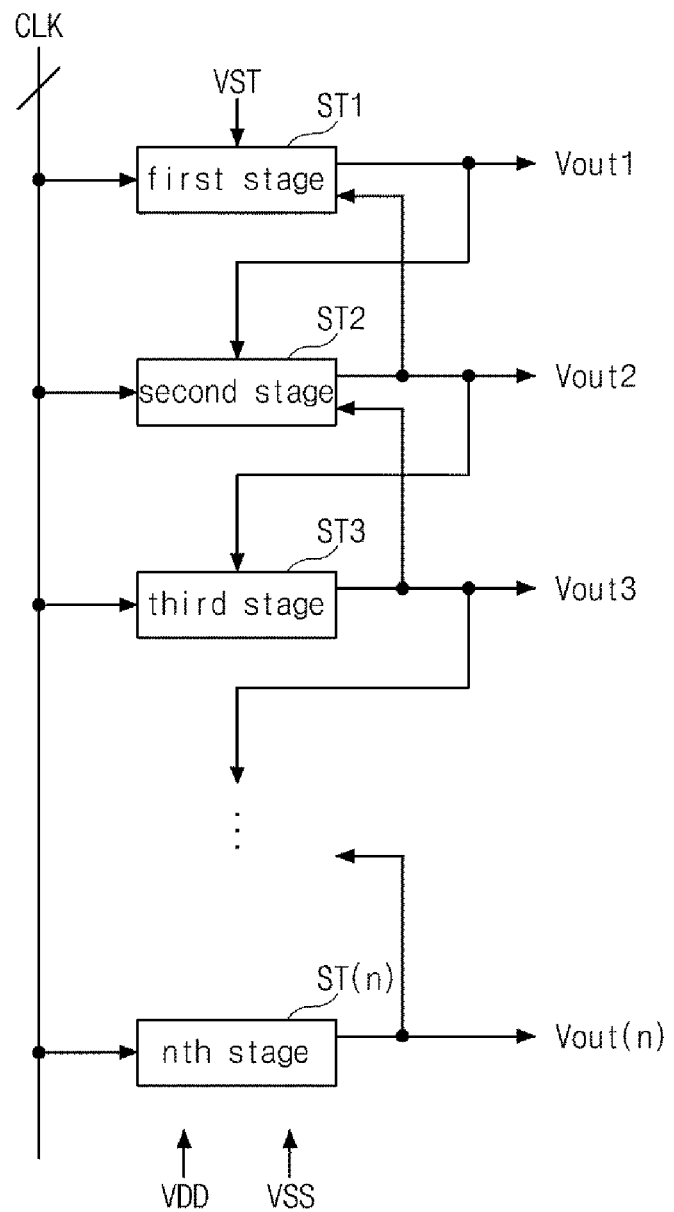
FIG. 4 is a view showing a gate shift register of a gate driving unit according to an embodiment of the present disclosure.

FIG. 4 is a view showing a gate shift register of a gate driving unit according to an embodiment of the present disclosure.

In FIG. 4, a gate shift register according to an embodiment of the present disclosure may sequentially output first to nth gate signals Vout1 to Vout(n) in response to the plurality of clock signals CLK and the start voltage VST provided by the timing controlling unit 800 (of FIG. 3). The gate shift register may include first to nth stages ST1 to ST(n). The first to nth stages ST1 to ST(n) may sequentially output first to nth gate signals Vout1 to Vout(n), respectively, once a frame. Each of the first to nth stages ST1 to ST(n) receive a high level voltage VDD, a low level voltage VSS and one of the plurality of clocksignals CLK. The high level voltage VDD and the low level voltage VSS are a direct current (DC) voltage, and the high level voltage VDD may have a voltage relatively higher than the low level voltage VSS.

Each of the first to nth stages ST1 to ST(n) may output the gate signal in response to the gate signal of a previous stage. Since the first stage ST1 does not have the previous stage, the first stage ST1 may output the first gate signal Vout1 using the start voltage VST provided by the timing controlling unit 800 (of FIG. 3).

In addition, each of the first to nth stages ST1 to ST(n) may output the gate signal in response to the gate signal of a next stage. Since the nth stage ST(n) does not have the next stage, the nth stage ST(n) may output the nth gate signal Vout(n) using a signal provided by a dummy stage (not shown).

For example, the first stage ST1 may output the first gate signal Vout1 in response to the start voltage VST, the clock signal CLK and the second gate signal Vout2 of the second stage ST2. Each of the second to nth stages ST2 to ST(n) may sequentially output the second to nth gate signals Vout2 to Vout(n), respectively, in response to the gate signal of the previous stage, the clock signal CLK and the gate signal of the next stage.

Each of the first to nth stages ST1 to ST(n) may include a plurality of transistors for outputting the first to nth gate signals Vout1 to Vout(n), and the first to nth stages ST1 to ST(n) may have a similar circuit structure and a similar operation to each other. As a result, the first stage ST1 will be illustrated as a representative hereinafter.

Figure 5:
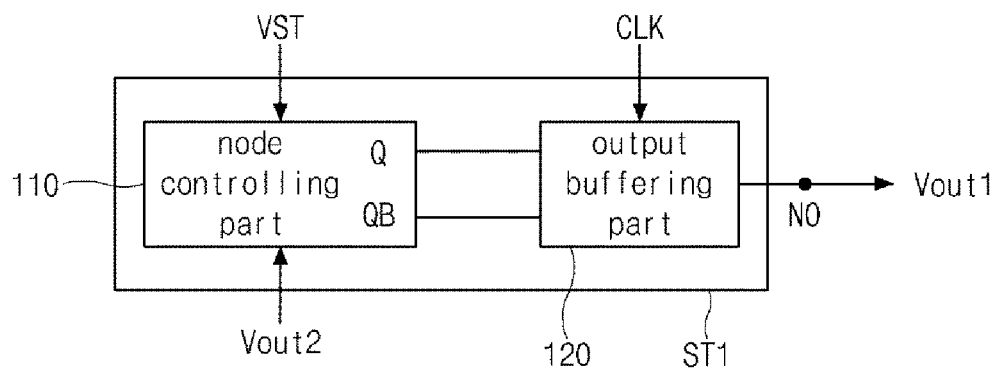
FIG. 5 is a view showing a first stage of a gate shift register of a gate driving unit according to an embodiment of the present disclosure.
Figure 6:
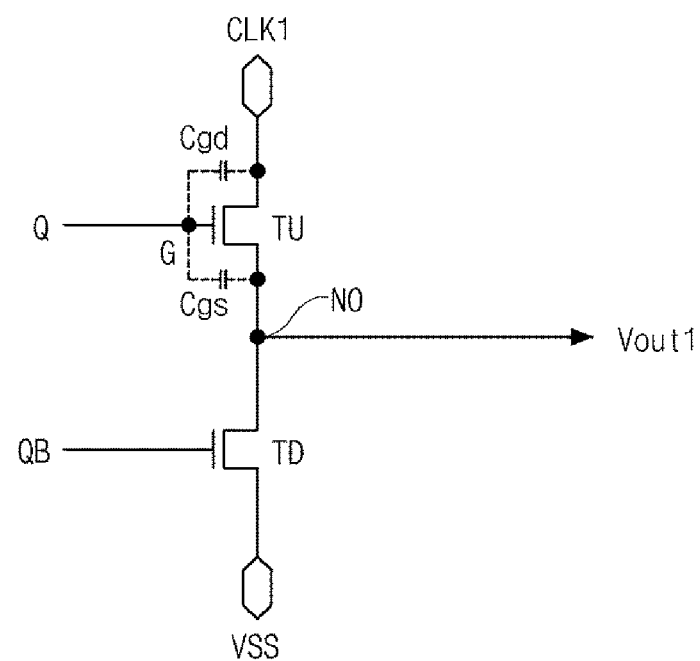
FIG. 6 is a view showing an output buffering part of a first stage of a gate shift register of a gate driving unit according to an embodiment of the present disclosure.

FIG. 5 is a view showing a first stage of a gate shift register of a gate driving unit according to an embodiment of the present disclosure, and FIG. 6 is a view showing an output buffering part of a first stage of a gate shift register of a gate driving unit according to an embodiment of the present disclosure.

In FIG. 5, a first stage ST1 includes a node controlling part 110 and an output buffering part 120. The node controlling part 110 includes a plurality of transistors (not shown) and at least one capacitor (not shown). The plurality of transistors may control a voltage of first and second nodes Q and QB in response to the start voltage VST and the second gate signal Vout2. The node controlling part 110 charges the second node QB with a high level voltage VDD in response to the second gate signal Vout2 and discharges the first node Q with a low level voltage VSS.

The output buffering part 120 receives the clock signal CLK from the timing controlling unit 800 (of FIG. 3). When the first node Q is charged with the high level voltage VDD, the output buffering part 120 applies the clock signal CLK to an output terminal NO. When the second node QB is charged with the high level voltage VDD, the output buffering part 120 applies the low level voltage VSS to the output terminal NO.

In FIG. 6, the output buffering part 120 includes a pull up transistor TU and a pull down transistor TD. The pull up transistor TU is turned on or off according to a voltage of the first node Q. When the pull up transistor TU is turned on, the clock signal CLK is applied to the output terminal NO. The pull down transistor TD is turned on or off according to a voltage of the second node QB. When the pull down transistor TD is turned on, the low level voltage is applied to the output terminal NO.

Since the clock signal CLK applied to a drain electrode D of the pull up transistor TU has a relatively high voltage and a relatively high frequency, the pull up transistor TU has the largest size and the largest area among the plurality of transistors in each of the first to nth stages ST1 to ST(n).

Figure 7:
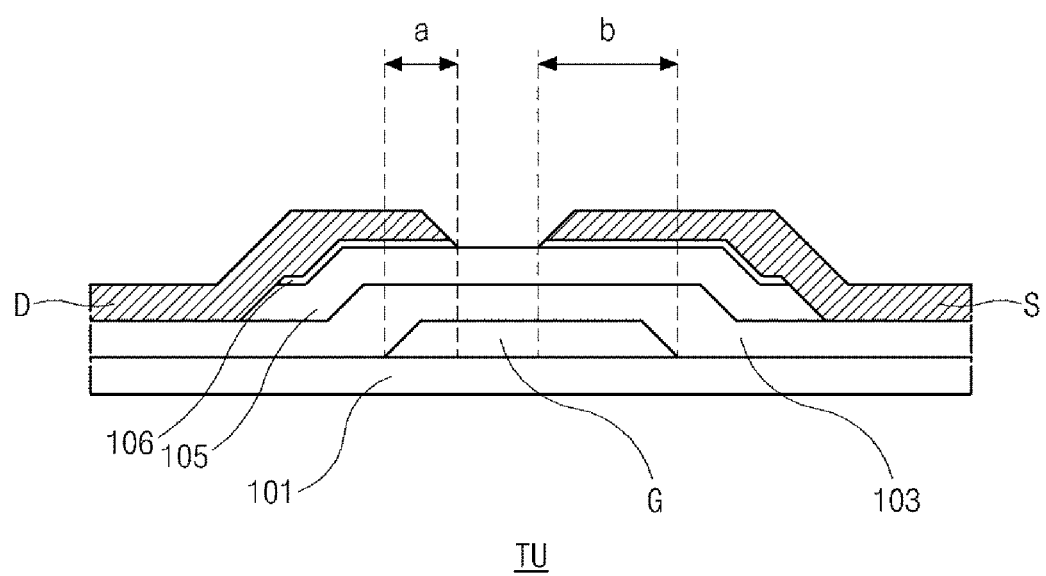
FIG. 7 is a cross-sectional view showing a pull up transistor of an output buffering part in a gate shift register of a gate driving unit according to an embodiment of the present disclosure.
Figure 8:
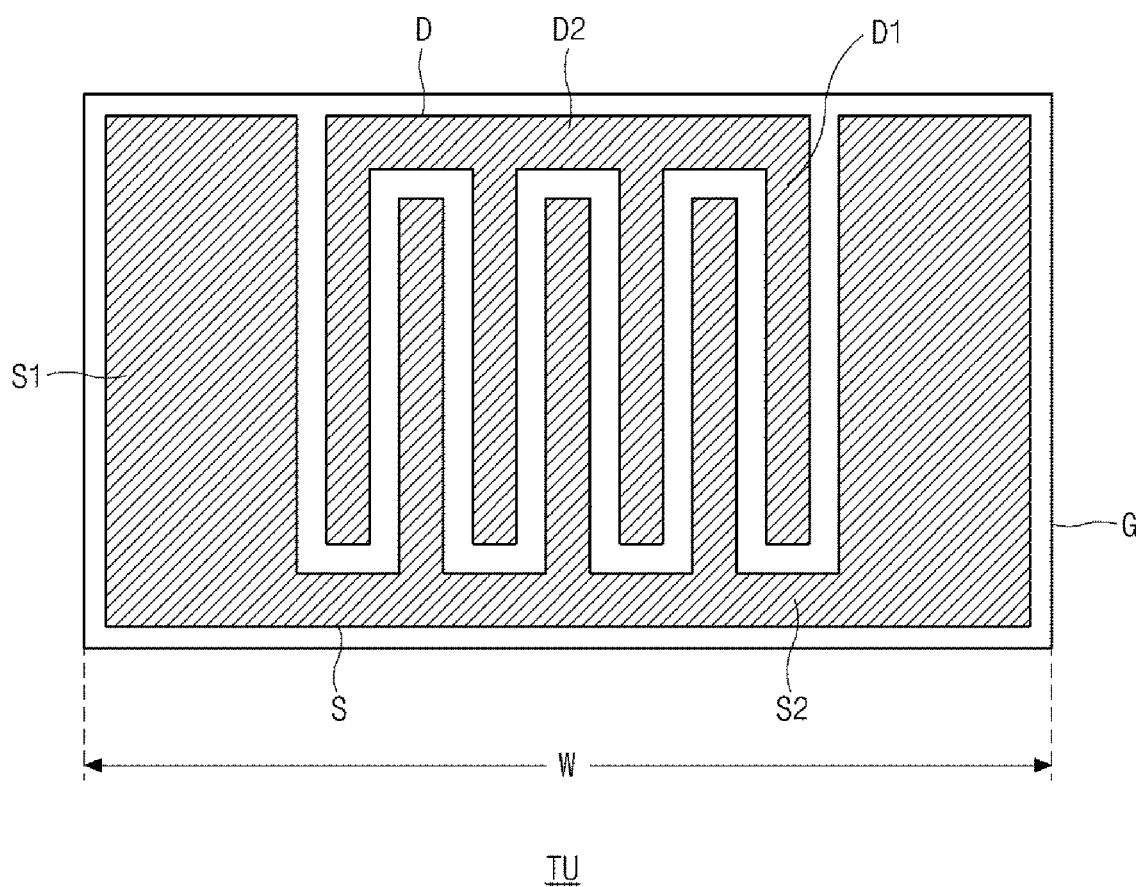
FIG. 8 is a plan view showing a pull up transistor of FIG. 7.

FIG. 7 is a cross-sectional view showing a pull up transistor of an output buffering part in a gate shift register of a gate driving unit according to an embodiment of the present disclosure, and FIG. 8 is a plan view showing a pull up transistor of FIG. 7.

In FIG. 7, the pull up transistor TU includes a gate electrode G, a gate insulating layer 103, an active layer 105, an ohmic contact layer 106, a source electrode S and a drain electrode D. The gate electrode G is formed on a substrate 101, and the gate insulating layer 103 is formed on the gate electrode G. The active layer 105 is formed on the gate insulating layer 103 over the gate electrode G, and the ohmic contact layer 106 is formed between the active layer 105 and the source electrode S and between the active layer 105 and the drain electrode D. The source electrode S and the drain electrode D are formed on the gate insulating layer 103 and are spaced apart from each other.

The gate electrode G of the pull up transistor TU is connected to the first node Q, the drain electrode D of the pull up transistor TU is connected to a signal line supplying the clock signal CLK, and the source electrode S of the pull up transistor TU is connected to a signal line outputting the first gate signal Vout1.

Since the clock signal CLK having a relatively high frequency and a relatively high voltage is applied to the drain electrode D of the pull up transistor TU, the first gate signal Vout1 outputted from the source electrode S of the pull up transistor TU may become unstable. To prevent the unstable gate signal, the pull up transistor TU is formed to have the largest size among the plurality of transistors of the gate shift resistor.

In the pull up transistor TU, a first area a where the gate electrode G and the drain electrode D overlap each other is smaller than a second area b where the gate electrode G and the source electrode S overlap each other (a<b). For example, the second area b may be 2.5 times to 6 times of the first area a. Since the first area a is smaller than the second area b, a capacitance of a parasitic capacitor Cgd (of FIG. 6) between the drain electrode D and the gate electrode G is smaller than a capacitance of a parasitic capacitor Cgs (of FIG. 6) between the source electrode S and the gate electrode G. For example, the capacitance of the parasitic capacitor Cgs between the source electrode S and the gate electrode G may be 2.5 times to 6 times of the capacitance of the parasitic capacitor Cgd between the source electrode S and the gate electrode G.

As a result, a width of the pull up transistor is reduced and a narrow bezel is obtained.

In FIG. 8, the source electrode S and the drain electrode D overlap the gate electrode G. The source electrode S of the pull up transistor TU includes a plurality of first source electrodes S1 each having a bar shape and a second source electrode S2 connected to ends of the plurality of first source electrodes S1. The drain electrode D includes a plurality of first drain electrodes D1 each having a bar shape and a second drain electrode D2 connected to ends of the plurality of first drain electrodes D1. The second source electrode S2 and the second drain electrode D2 face into each other. The plurality of first source electrodes S1 and the plurality of first drain electrodes D1 are alternately disposed with each other and are spaced apart from each other. The other ends of the plurality of first source electrodes S1 are spaced apart from the second drain electrode D2, and the other ends of the plurality of first drain electrodes D1 are spaced apart from the second source electrode S2.

The outermost first source electrodes S1 at both sides of the plurality of first source electrodes S1 have a width greater than the other first source electrodes S1 between the outermost first source electrodes S1. The other first source electrodes S1 between the outermost first source electrodes S1 have the same width as the first drain electrodes D1. The second drain electrode D2 has the same width as the second source electrode S2. The plurality of first source electrodes S1 and the plurality of first drain electrodes D1 are spaced apart from each other by the same distance and have the same length.

As a result, the second area b where the source electrode S and the gate electrode G overlap each other may be 2.5 times to 6 times of the first area a where the drain electrode D and the gate electrode overlap each other. In addition, the capacitance of the parasitic capacitor Cgs (of FIG. 6) between the source electrode S and the gate electrode G may be 2.5 times to 6 times of the capacitance of the parasitic capacitor Cgd (of FIG. 6) between the source electrode S and the gate electrode G.

As a capacitance ratio Cgd:Cgs of the capacitance of the parasitic capacitor Cgd between the source electrode S and the gate electrode G and the capacitance of the parasitic capacitor Cgs between the source electrode S and the gate electrode G increase, a voltage of the first node Q increases. For example, when the capacitance ratio Cgd:Cgs increases from about 1:1 to about 1:2.5, the voltage of the first node Q may increase by about 2V. When the voltage of the first node Q increases, the first gate signal Vout1 outputted from the source electrode S of the pull up transistor TU may be stabilized.

The voltage of the first node Q does not continuously increases according to increase of the capacitance ratio Cgd:Cgs. Instead, the voltage of the first node Q is saturated. For example, the voltage of the first node Q may be saturated when the capacitance ratio Cgd:Cgs is about 1:6.

Since increase of the voltage of the first node Q through adjustment of the capacitance ratio Cgd:Cgs has a limit, the plurality of first source electrodes S1 and the plurality of first drain electrodes D1 are formed to have a number over a predetermined reference number. As a result, the pull up transistor TU may include a plurality of channels greater than the reference number.

Figure 2:
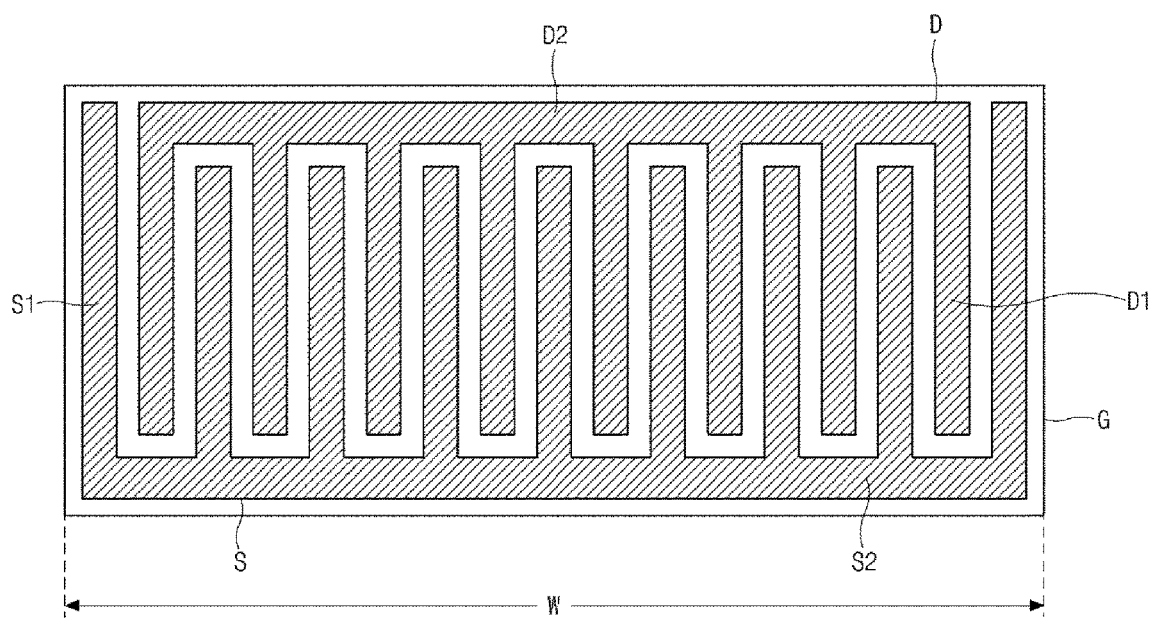
FIG. 2 is a plan view showing a pull up transistor of FIG. 1.

In the LCD device according to the embodiment of the present disclosure, the first gate signal Vout1 outputted from the source electrode S of the pull up transistor TU is stabilized by adjusting the capacitance ratio Cgd:Cgs without increase of the number of the channels between the first source electrode S1 (of FIG. 2) and the first drain electrode D1 (of FIG. 2) by increasing the width W of the pull up transistor TU as in the related art LCD device. Accordingly, the LCD device according to the embodiment of the present disclosure has a smaller width W of the pull up transistor TU as compared with the related art LCD device, and the narrow bezel is obtained.

Figure 9:
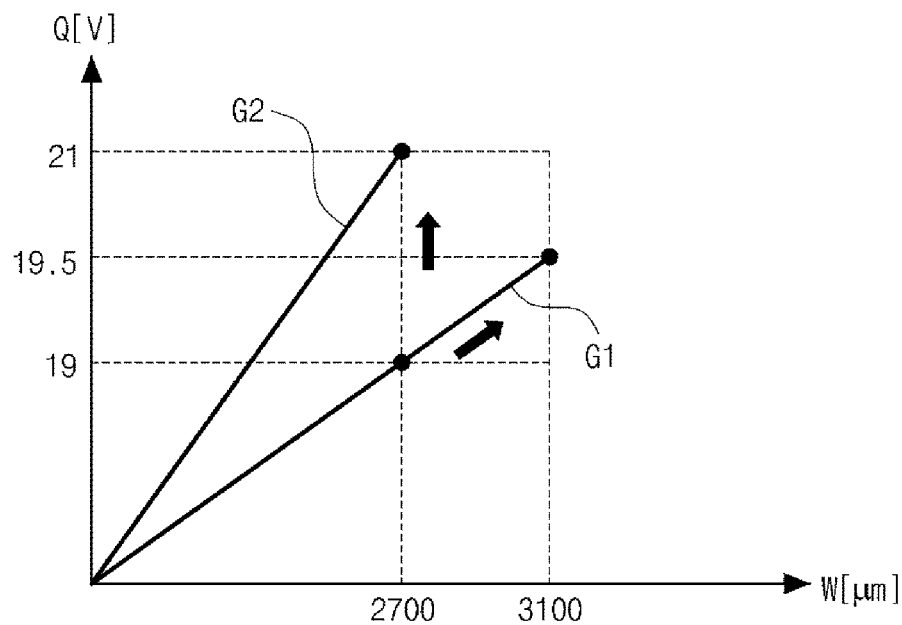
FIG. 9 is a view showing a voltage of a first node with respect to a width in a gate shift register of a gate driving unit according to an embodiment of the present disclosure.

FIG. 9 is a view showing a voltage of a first node with respect to a width in a gate shift register of a gate driving unit according to an embodiment of the present disclosure.

In FIG. 9, a first graph G1 shows a voltage of the first node Q with respect to a width of the pull up transistor of a gate shift register according to the related art, and a second graph G2 shows a voltage of the first node Q with respect to a width of the pull up transistor of a gate shift register according to an embodiment of the present disclosure.

As in the first graph G1, the voltage of the first node Q increases by about 0.5V when the width of the pull up transistor of the related art increases from about 2700 μm to about 3100 μm. As in the second graph G2, the voltage of the first node Q increases by about 2V when the pull up transistor of the embodiment of the present disclosure has the width of about 2700 μm and the capacitance ratio Cgd:Cgs of about 1:2.5 to 1:6.

For supplying a stable gate signal, forming the capacitance of the parasitic capacitor Cgs (of FIG. 6) between the source electrode S and the gate electrode G greater than the capacitance of the parasitic capacitor Cgd (of FIG. 6) between the drain electrode D and the gate electrode G is more effective than increasing the number of the channels by increasing the width W of the pull up transistor TU. Since the width W of the pull up transistor TU is reduced, the narrow bezel is obtained. Since increase of the voltage of the first node Q through adjustment of the capacitance ratio Cgd:Cgs has a limit, the pull up transistor TU is formed to have a width over a predetermined reference width.

Consequently, in a gate driving unit according to an embodiment of the present disclosure, since a ratio of the capacitance between the gate electrode and the drain electrode and the capacitance between the gate electrode and the source electrode, a width of the pull up transistor is reduced. As a result, an LCD device having a narrow bezel is obtained.

It will be apparent to those skilled in the art that various modifications and variations can be made in embodiments of the present disclosure without departing from the spirit or scope of the disclosure. Thus, it is intended that the present disclosure cover the modifications and variations of embodiments of the disclosure provided they come within the scope of the appended claims and their equivalents.

What is claimed is:

1. A gate driving unit comprising a plurality of stages configured to sequentially output a plurality of gate signals, wherein each of the plurality of stages includes a first transistor comprising:
    a gate electrode;
    a gate insulating layer on the gate electrode; and
    a source electrode and a drain electrode on the gate insulating layer over the gate electrode, the source electrode and the drain electrodes spaced apart from each other,
    wherein a first area where the gate electrode and the source electrode overlap each other is 2.5 times to 6 times of a second area where the gate electrode and the drain electrode overlap each other,
    wherein the source electrode includes a plurality of first source electrodes, each having a bar shape,
    wherein the drain electrode includes a plurality of first drain electrodes, each having a bar shape, and
    wherein two outermost first source electrodes of the plurality of first source electrodes are disposed outside two outermost first drain electrodes of the plurality of first drain electrodes, respectively.

2. The gate driving unit of claim 1, wherein the source electrode further includes a second source electrode connected to ends of the plurality of first source electrodes, and
    wherein the drain electrode further includes a second drain electrode connected to ends of the plurality of first drain electrodes.

3. The gate driving unit of claim 2, wherein the second source electrode and the second drain electrode face into each other, and the plurality of first source electrodes and the plurality of first drain electrodes are alternately disposed with each other.

4. The gate driving unit of claim 3, wherein outermost first source electrodes of the plurality of first source electrodes have a width greater than the other first source electrodes.

5. The gate driving unit of claim 4, wherein the other first source electrodes between the outermost first source electrodes have a same width as the first drain electrodes.

6. The gate driving unit of claim 5, wherein the plurality of first source electrodes and the plurality of first drain electrodes are spaced apart from each other by a same distance and have a same length.

7. The gate driving unit of claim 1, wherein each of the plurality of stages includes an output buffering part outputting the plurality of gate signals and a node controlling part controlling the output buffering part.

8. The gate driving unit of claim 7, wherein the output buffering part includes a pull up transistor applying a clock signal to an output terminal according to a voltage of a first node and a pull down transistor applying a low level voltage to the output terminal according to a voltage of a second node, and
wherein the first transistor is the pull up transistor.

9. The gate driving unit of claim 8, wherein the node controlling part charges and discharges the first and second nodes.

10. A liquid crystal display device comprising a display panel, a gate driving unit, a data driving unit and a timing controlling unit, the gate driving unit comprising a plurality of stages configured to sequentially output a plurality of gate signals,
wherein each of the plurality of stages includes a first transistor comprising:
a gate electrode;
a gate insulating layer on the gate electrode; and
a source electrode and a drain electrode on the gate insulating layer over the gate electrode, the source electrode and the drain electrodes spaced apart from each other,
wherein a first area where the gate electrode and the source electrode overlap each other is 2.5 times to 6 times of a second area where the gate electrode and the drain electrode overlap each other,
wherein the source electrode includes a plurality of first source electrodes, each having a bar shape,
wherein the drain electrode includes a plurality of first drain electrodes, each having a bar shape, and
wherein two outermost first source electrodes of the plurality of first source electrodes are disposed outside two outermost first drain electrodes of the plurality of first drain electrodes, respectively.

11. The liquid crystal display device of claim 10, wherein the source electrode further includes a second source electrode connected to ends of the plurality of first source electrodes, and
wherein the drain electrode further includes a second drain electrode connected to ends of the plurality of first drain electrodes.

12. The liquid crystal display device of claim 11, wherein the second source electrode and the second drain electrode face into each other, and the plurality of first source electrodes and the plurality of first drain electrodes are alternately disposed with each other.

13. The gate driving unit of claim 12, wherein outermost first source electrodes of the plurality of first source electrodes have a width greater than the other first source electrodes.

14. The liquid crystal display device of claim 13, wherein the other first source electrodes between the outermost first source electrodes have a same width as the first drain electrodes.

15. The liquid crystal display device of claim 14, wherein the plurality of first source electrodes and the plurality of first drain electrodes are spaced apart from each other by a same distance and have a same length.

* * * * *